United States Patent [19]

Ritter

[11] Patent Number: 5,045,407

[45] Date of Patent: Sep. 3, 1991

[54] SILICON CARBIDE FIBER-REINFORCED TITANIUM BASE COMPOSITES HAVING IMPROVED INTERFACE PROPERTIES

[75] Inventor: Ann M. Ritter, Schenectady, N.Y.

[73] Assignee: General Electric Company, Schenectady, N.Y.

[21] Appl. No.: 455,048

[22] Filed: Dec. 22, 1989

[51] Int. Cl.$^5$ .................... C22C 1/09; C22C 14/00
[52] U.S. Cl. ..................................... 428/614; 427/34
[58] Field of Search ........................... 428/614; 427/34

[56] References Cited

U.S. PATENT DOCUMENTS 4,782,884 11/1988 Siemers .

FOREIGN PATENT DOCUMENTS 2219006 11/1989 United Kingdom .

OTHER PUBLICATIONS

Singh, "Fiber/Matrix Interfacial Characteristics in Fiber-Reinforced, Ceramic-Matrix Composite", Engineered Materials Ab. 8912-C1-D-2455.

Brewer et al., "Metallurgical and Tensil Property Analysis of Several Silicon Carbide/Titanium . . . ", Metals Abs 84-620054 and 82-630400.

Sakai et al.,."Compatibility of Nickel Coated Sic Fibers", Nonferous Metals Abstract #8200849.

*Primary Examiner*—Theodore Morris
*Assistant Examiner*—David W. Schumaker
*Attorney, Agent, or Firm*—Paul E. Rochford; James C. Davis, Jr.; James Magee, Jr.

[57] ABSTRACT

The matrix is an alloy having an alpha-2 crystal form. The matrix is reinforced with silicon carbide filaments. To reduce the tendency of the matrix to form cracks due to the brittle nature of the interface with the SiC filaments, the surface of the filaments is coated with a beta phase stabilizer composition. Such a composition contains at least one element selected from the group consisting of Mo, Cr, W, Ta, Pd, Nb, Ag, Zr, Hf, V, Re, Ir, Mn, Fe, Co, Ni, Cu, Pt, Au, and Sn.

9 Claims, 1 Drawing Sheet

SILICON CARBIDE FIBER-REINFORCED TITANIUM BASE COMPOSITES HAVING IMPROVED INTERFACE PROPERTIES

CROSS REFERENCE TO RELATED APPLICATIONS

The present invention relates generally to application Ser. No. 04/445,203, filed Dec. 4, 1989; Ser. No. 07/455,041, filed Dec. 22, 1989; and to Ser. No. 07/459,894, filed Jan. 2, 1990. These related applications are incorporated herein by reference.

BACKGROUND OF THE INVENTION

The present invention relates generally to composites having a titanium base matrix reinforced by silicon carbide fiber or filament reinforcement. More particularly, it relates to improvements in the filament and matrix components of a silicon carbide reinforced titanium aluminide composite.

The preparation of titanium alloy base foils and sheets and of reinforced structures in which silicon carbide fibers are embedded in a titanium base alloy are described in the patents: U.S. Pat. Nos. 4,775,547; 4,782,884; 4,786,566; 4,805,294; 4,805,833; and 4,838,337; assigned to the same assignee as the subject application. The preparation of these composites is the subject of intense study inasmuch as the composites have very high strength property in relation to their weight. Prior to the development of the processes described in the above-referenced patents, such structures were prepared by sandwiching the reinforcing filaments between foils of titanium base alloy and pressing the stacks of alternate layers of alloy and reinforcing filament until a composite structure was formed. However, that prior art practice resulted in fracture of the reinforcing filaments to a degree that many of the beneficial advantages of the reinforced product were lost or were not achieved to the degree sought because of the filament fracture problem.

The structures taught in the above-referenced patents greatly improved over the earlier practice of forming sandwiches by compression.

It has been found that while the structures prepared as described in the above-referenced patents have properties which are a great improvement over earlier structures, the attainment of the potentially very high ultimate tensile strength in these structures did not measure up to the values theoretically possible.

The testing of composites formed according to the methods taught in the above patents has demonstrated that although modulus values are generally in good agreement with the rule of mixture predictions, the ultimate tensile strength is usually much lower than predicted by the underlying properties of the individual ingredients to the composite.

Further, for certain titanium base alloys, testing has shown that the total strain to composite fracture is relatively low and, in addition, extensive off-plane cracking of the matrix has been observed. I have found that the matrix in certain composites consists primarily of an alpha-2 crystal form which is an ordered intermetallic phase. The secondary constituent of the matrix is small amounts of beta-phase. This crystal form exists in alloys containing 14 weight % aluminum and 21 weight % niobium in a titanium base. The alpha-2 crystal material of such alloys tends to have low ductility and envelopes of this phase around the SiC fibers have been found to crack during consolidation of the matrix and fibers into a reinforced composite.

From my work and from the observations and analysis that have been made, I conceived the notion that modification of the phase distribution of the alloy in the matrix could contribute toward inhibiting matrix cracking and could result in property improvement.

BRIEF STATEMENT OF THE INVENTION

It is, accordingly, one object of the present invention to improve the properties of filament reinforced titanium base matrix composites, and particularly those composites which have predominantly alpha-2 matrix.

Another object is to provide a method which permits improvements to be made in the matrix of reinforced composites having titanium base matrices of alpha-2 crystal form.

Another object is to provide a convenient control for optimizing the properties of a matrix of a composite having a titanium base alloy matrix of the alpha-2 crystal form.

Other objects will be in part apparent and in part pointed out in the description which follows.

In one of its broader aspects, objects of the present invention can be achieved by:
providing a plurality of strands of a reinforcing silicon carbide,
depositing onto said strands a surface layer of a beta phase stabilizer metal, and
plasma-spray depositing over said surface layer a matrix of a titanium base alloy having predominantly an alpha-2 crystal form.

BRIEF DESCRIPTION OF THE DRAWINGS

The description which follows will be understood with greater clarity if reference is made to the accompanying drawings in which.

DETAILED DESCRIPTION OF THE INVENTION

Figure 1:
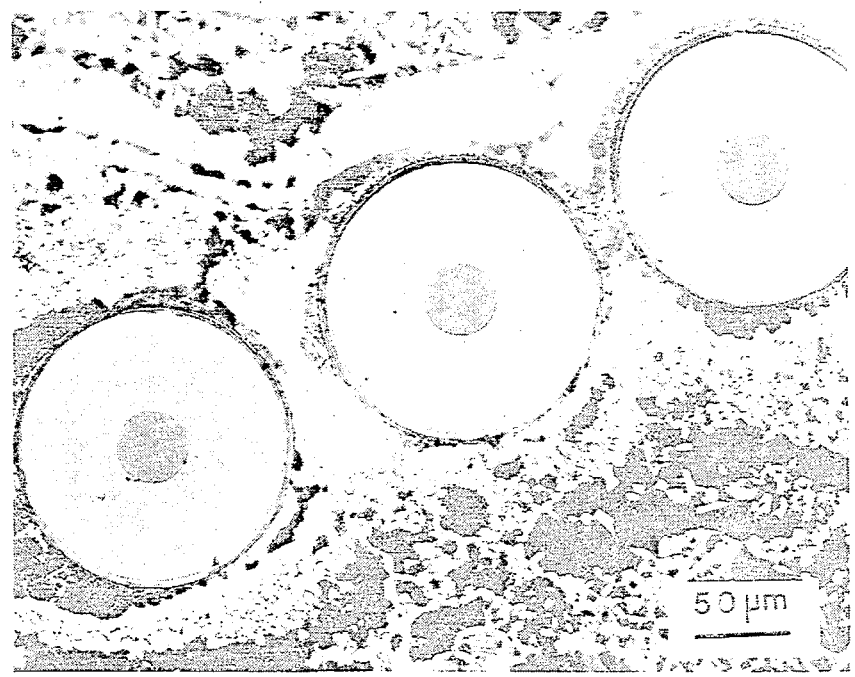
FIG. 1 is a micrograph of a composite of SiC filaments in a titanium base matrix.

I have found that some titanium base alloys consist primarily of alpha-2 phase which is an ordered intermetallic phase.

As is well known, an ordered intermetallic phase is characterized by having certain of the elements of the intermetallic composition located on specific lattice sites in the crystal lattice. It is also recognized that the alpha-2 as an ordered intermetallic phase has greater tendency toward low ductility than other phases which could be present, such as beta-phase.

As indicated above, where silicon carbide fibers are embedded as reinforcement into a titanium base alloy matrix and where the matrix consists primarily of alpha-2 intermetallic phase, there is a tendency for the formation of radial cracks in the alpha-2 phase. It has been observed that the radial cracks in the alpha-2 envelope surrounding the silicon carbide fibers tend to propagate into the surrounding matrix when the composite material is loaded in tension. Such propagation may affect the over-all mechanical properties by leading to premature composite failure. Such failure by embrittlement of the matrix is observed when lateral tension is applied to the matrix and this failure is enhanced by the presence of the radial cracks in the portion of the alpha-2 which forms an envelope about the fibers.

I have discovered that the strength and ductility of the matrix could be substantially improved if the radial cracks formed in the matrix envelope surrounding the filaments of the fibers could be reduced or eliminated. I have discovered that I can accomplish this I have employed beta-phase stabilizers to reduce or eliminate or prevent the formation of the radial cracks in the alpha-2 envelope surrounding the silicon carbide fibers. I have found that a preferred way of increasing the fraction of the envelope around the fibers, which is beta-phase or transformed beta-phase rather than the alpha-2 phase, is by coating the fibers prior to embedment in the titanium base matrix with a metal or combination of metals which serve as a beta-phase stabilizer. The metals which can be employed as beta-phase stabilizers include a more preferred group of Nb, Zr, Hf, V, Mo, Ta, and Re. A preferred group includes the following metals: Cr, W, Mn, Fe, Co, Ni, Cu, Pd, Ag, Pt, Ir, Au, and Sn.

A silicon carbide fiber or filament can be coated with one or more of these beta-phase stabilizer metal elements or with some combination of the elements and when so coated can serve as a desirable starting material for forming a reinforced composite structure in which the matrix is a titanium base alloy which is characterized by a predominance of the alpha-2 ordered intermetallic phase. The silicon carbide fiber which is coated with a surface coating of a beta-phase stabilizer is a very useful and desirable article for use in preparing a matrix of a silicon carbide fiber and a titanium base matrix. Further, the metals may be employed in alloy form particularly where the alloy is one which has a desirable set of properties in addition to its ability to serve as a beta-phase stabilizer. For example, a niobium base alloy which may be employed as a beta-phase stabilizer pursuant to the present invention and which may, accordingly be desirably formed into a coating on the surface of silicon carbide fibers is the alloy Nb; 31-48 a/o Ti; 8-21 Al. This alloy is disclosed in the copending application Ser. No. 331,762, filed Apr. 3, 1989, and assigned to the same assignee as the subject invention. The text of the copending application is incorporated herein by reference.

The manner in which the coating may be formed on the silicon carbide fiber may be selected from a number of different methods and these methods may be used either alone or in combination to apply a coating layer of a beta-phase stabilizer composition to the surface of the silicon carbide fibers before the reinforced composite is formed therefrom. One method which I have used to coat the silicon carbide fibers is by r.f. diode sputtering. Alternative methods which may be employed include d.c. diode sputtering, d.b./r.f. magnetron sputtering, chemical vapor deposition, electroless plating, plasma-sprayed deposit, electroplating, ion plating, evaporation, ion-enhanced evaporation, ion-plating and other conventional coating methods. It is not necessary to form a very thick layer of the beta-phase stabilizer element on the silicon carbide fiber in order to provide an effective coating to impart the stabilized beta-phase crystal form to the matrix envelope which surrounds the individual fibers. By matrix envelope, as used herein, is meant the portion of the matrix which immediately surrounds the fibers. This is the portion of the matrix in which the radial cracks were observed to form prior to the use of my method of reducing and/or eliminating such occurrence.

Only a small thickness of one or more of the beta phase stabilizers is needed on the reinforcing fibers. However, this small thickness is responsible for developing a zone of stabilized beta crystal form in the matrix surrounding the coated fiber. A zone of 10 to 20 microns or more of beta-stabilized matrix develops around the fiber from diffusion of the beta phase stabilizer during the consolidation step of the composite preparation process.

Uniform application of the beta-phase stabilizer elements to the surface of the silicon carbide fibers is desirable although not essential to the successful practice of the present invention. Generally, the more uniformly the beta stabilizer is present on the fiber when the matrix is applied to the fibers the more uniform the beta-phase stabilized zone and the lower the tendency for radial cracks to develop.

In other words, the sequence of steps which are followed in the practice of the present invention is to first provide a set of fibers to be embedded in titanium base matrix, and second, to coat the fibers with a beta-phase stabilizer composition containing one or more of the metal elements selected from the group consisting of molybdenum, rhenium, vanadium, zirconium, hafnium, chromium, tungsten, niobium, tantalum, iridium, palladium, platinum, manganese, iron, cobalt, nickel, copper, gold, tin, and silver. After the fiber has been suitably coated with a layer of the beta-phase stabilizer composition, the fibers are embedded in the titanium base matrix. The embedment can be carried out by a number of methods. A preferred method is that described in the patents which are referred to and listed above.

Following the embedment, the composite is consolidated by heat and pressure. The heat and pressure cause an interdiffusion of the beta-phase stabilizer with the titanium base matrix and it is this interdiffusion which creates the beta-phase stabilized envelope around the individual filaments. Such consolidation may be carried out, for example, at a temperature of about 1,000° C. or above by pressing with a pressure of 10-20 ksi for a period of from 1 to about 5 hours.

The manner in which the present invention may be carried out is described with reference to the following example:

EXAMPLE 1

A supply of silicon carbide fibers identified as SCS-6 fibers were obtained from the Textron Specialty Materials Company. The fibers as obtained were then sputter coated with a layer of niobium metal about one micron in thickness. The coated fibers were then placed on a steel plate and the ends of the fibers were held down by tack-welded nickel chromium foil. A supply of a fine titanium base powder was obtained. The titanium base powder had a composition containing 15 weight % aluminum, 21 weight % niobium, and the remainder titanium The powder was sieved and the fraction having a particle size of 105-177 microns was selected. This powder corresponded to the size fraction of −80+140 obtained by the sieving procedure.

The niobium coated fibers were then plasma-sprayed with the Ti-15Al-21Nb powder fraction to form a deposit of the alloy on and about the individual fiber specimens of the array of fibers mounted to the steel plate. An RF plasma gun was employed in depositing the titanium base alloy. A plasma gun employed is essentially that described in copending application Ser. No. 07/524,527, filed May 17, 1990. Alternatively, the RF plasma-spraying of the titanium base powder may be carried out pursuant to the methods described in the above referenced patents. In carrying out the plasma-sprayed deposition of the titanium base alloy, the hydrogen level in the plasma gas was maintained at 3%. The remaining constituents of the gas were argon and helium in the ratio of about 1/3 argon and 2/3 helium.

The Ti-15Al-21Nb powder was plasma-sprayed onto the steel plate holding the coated fibers. After deposition of the titanium base alloy, the fiber containing foil was removed from the substrate by chemical dissolution. The separated fiber containing foil formed by the plasma deposition of the titanium base alloy was placed between two layers of fiberless Ti-14Al-21Nb foil in preparation for HIPing the sandwich of 3 foils with the fiber bearing foil sandwiched between the two fiberless titanium base foils. The assembled sandwich of foils was sealed within an outer HIPing can and evacuated. The evacuated HIPing can was heated to 1,000° and HIPed for 3 hours at 15 ksi pressure.

Figure 2:
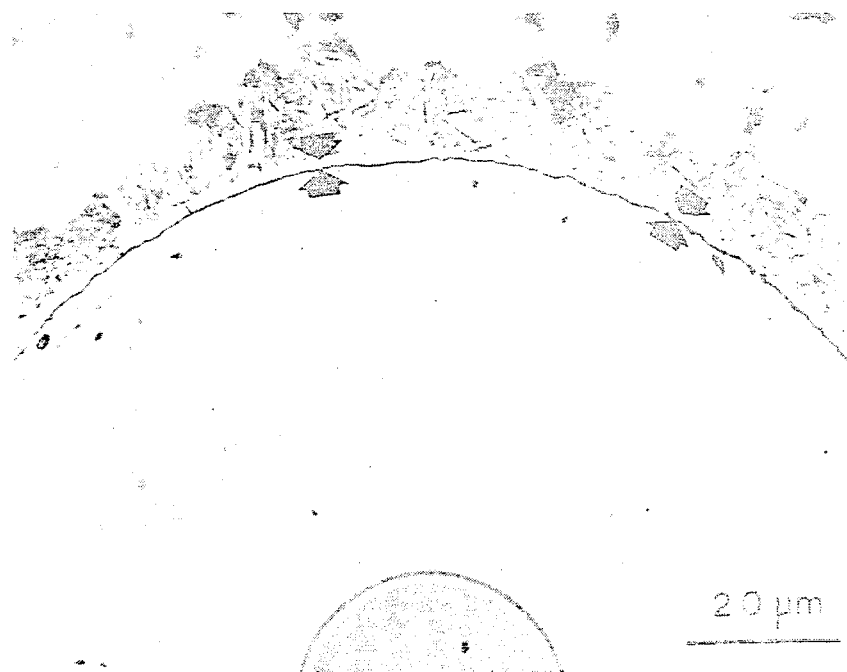
FIG. 2 is a detail of a micrograph as described relative to FIG. 1.

The HIPed structure was sectioned and a micrograph was prepared displaying the microstructure of the HIPed deposit. This microstructure is shown in the attached FIG. 1. The specimens as shown are etched to display the different crystal structure. The dark etched phase is the beta-phase or transformed beta-phase. The light regions are the alpha-2 phase of the composite structure. An examination of the micrograph reveals that there was generally a beta-phase or a transformed beta-phase region in the matrix around the fibers and that this structure comprised an envelope of beta-phase microstructure around the fibers. What was regarded as particularly important is that there was no continuous alpha-2 envelope around the fibers. As is evident from the micrographs, no cracks were seen in the beta-phase regions adjacent to the fibers. This is evident both from the micrograph of FIG. 1 and the more detailed micrograph of FIG. 2. The two pairs of arrows in FIG. 2 are placed to denote the reaction zone between the fiber and matrix This reaction zone, which results from reactions between the fiber, the 1 micron coat of niobium and the titanium base matrix, is smaller than the reaction zone formed in the absence of the niobium surface layer.

By comparison in a composite produced using the same plasma deposition parameters and the same HIP conditions, there was a continuous alpha-2 envelope of about 4-5 microns thick around the fibers and there were numerous cracks in the alpha-2 envelope. I have observed that the reaction zone in the material made using the niobium-coated fibers was about 0.5-1.0 microns thick. By comparison, in the composite produced using uncoated fibers, the reaction zone was about 2.5 microns thick. The thickness of the reaction zone is deemed to be significant and it is preferred pursuant to the present invention to keep the reaction zone to smaller dimensions of about 0.5 to one micron as a greater thickness is deemed to have a deleterious effect on mechanical properties.

What is shown by the experiments of Example 1 is that a microstructural modification of the matrix regions near the fibers can be achieved by altering the surface chemistry of the fibers before composite fabrication. The measures taken in altering the surface chemistry have been shown to be effective and the use of a surface layer of a beta stabilizer material is effective in accomplishing the modification.

Coatings of beta-phase stabilizer metals of 0.5 to 5 microns are useful in the practice of the present invention.

The titanium base matrix having an alpha-2 crystal form need not be Ti-15Al-21Nb alone but may be an alloy within the range of Ti-13-16Al-19-23Nb. Alternatively, it may be another titanium base alloy matrix having an alpha 2 crystal form.

What is claimed is:

1. A reinforced structural member which comprises,
    a matrix of a titanium base alloy having an alpha-2 crystal structure,
    an array of reinforcing silicon carbide filaments in said matrix,
    a coating of a beta-phase stabilizer selected from the group consisting of Mo, Cr, W, Nb, Ta, Ir, Pd, Pt, Zr, Hf, Re, V, Ag, Mn, Fe, Co, Ni, Cu, Au, and Sn, on said filaments, and
    said coating being interdiffused with said matrix to provide a beta-phase stabilized diffusion zone which is substantially free of cracks.

2. The member of claim 1, in which the coating is about 0.5 to 5 microns in thickness.

3. The member of claim 1, in which the coating is about 0.5 to 1.5 microns in thickness.

4. A reinforced structural member which comprises,
    a matrix of a titanium base alloy having an alpha-2 crystal structure,
    an array of reinforcing silicon carbide filaments in said matrix,
    a coating of a beta-phase stabilizer selected from the group consisting of Nb, Mo, Ta, Pt, Zr, Hf, Re, and V on said filaments, and
    said coating being interdiffused with said matrix to provide a beta-phase stabilized diffusion zone which is substantially free of cracks.

5. The member of claim 4, in which the coating is about 0.5 to 5 microns in thickness.

6. The member of claim 4, in which the coating is about 0.5 to 1.5 microns in thickness.

7. The method of reducing cracking at the interface of a silicon carbide filamentary reinforcement and a titanium base alloy matrix having alpha-2 crystal form which comprises,
    depositing on the surface of the reinforcing filaments prior to assembly a coating of a beta-phase stabilizer metal,
    plasma spray depositing the matrix onto said filamentary reinforcement, and
    consolidating the filamentary reinforcement into said matrix by heat and pressure.

8. The method of claim 7, in which the titanium base alloy is Ti-13-16Al-9-23Nb.

9. The method of claim 7, in which the titanium base alloy is Ti-15Al-21Nb.

* * * * *